US005964344A

United States Patent [19]

Hatada

[11] Patent Number: 5,964,344

[45] Date of Patent: Oct. 12, 1999

[54] WAFER STORAGE BOX AND METHOD FOR PREVENTING ATTACHMENT OF DUST CAUSED BY STATIC ELECTRICITY ON A WAFER STORAGE BOX

[75] Inventor: Hirotaka Hatada, Kumamoto, Japan

[73] Assignee: NEC Corporation, Tokyo, Japan

[21] Appl. No.: 09/061,169

[22] Filed: Apr. 16, 1998

[30] Foreign Application Priority Data

Apr. 16, 1997 [JP] Japan .................................... 9-099147

[51] Int. Cl.[6] ...................................................... B65D 85/48

[52] U.S. Cl. ............................................. 206/205; 206/710

[58] Field of Search ..................................... 206/454, 710, 206/711, 712, 205, 213.1, 316.1, 832

[56] References Cited

U.S. PATENT DOCUMENTS

| | | | |
|---|---|---|---|
| 5,743,409 | 4/1998 | Nakahara et al. | 206/710 |
| 5,788,082 | 8/1998 | Nyseth | 206/711 |

FOREIGN PATENT DOCUMENTS

| | | |
|---|---|---|
| 0 248 925 | 12/1987 | European Pat. Off. . |
| 0 684 631 | 11/1995 | European Pat. Off. . |
| 1-137536 | 9/1989 | Japan . |
| 4-7855 | 1/1992 | Japan . |
| 4-61122 | 2/1992 | Japan . |

*Primary Examiner*—Jacob K. Ackun
*Attorney, Agent, or Firm*—Young & Thompson

[57] ABSTRACT

A carrier 2 that holds a wafer 3 is shut off from the outside environment by causing a box 1 and a box plate 4 to come into intimate physical contact by means of a box plate joiner 7. When this is done, a switch 9 of a electricity charger/discharger 5 is set to a first position so as to charge electricity to the box 1 via power supply circuit 10, causing dust within the box 1 to be attached to the inner walls 1*a* of the box 1 by electrostatic attraction. Thereafter, even if the box plate 4 that was joined to the box 1 is removed from the electricity charger/discharger 5, because the electricity of the box 1 remains, the electrostatic attraction effect persists. Thus, once dust is attracted, it remains attached to the inner walls 1*a* of the box 1.

6 Claims, 3 Drawing Sheets

1a 1 2 3 6 6 1b 6 8 9 A B 7 10e 20 4 8 5 10

1a 1 1c 2 3 8 9 A B 7 10e 20 4 8 5 10

WAFER STORAGE BOX AND METHOD FOR PREVENTING ATTACHMENT OF DUST CAUSED BY STATIC ELECTRICITY ON A WAFER STORAGE BOX

BACKGROUND OF THE INVENTION

1. Field of the Invention

The present invention relates to a wafer storage box for preventing the attachment of dust caused by static electricity on a wafer storage box.

2. Description of Related Art

A wafer storage box for preventing the attachment of dust is disclosed in the Japanese Unexamined Patent Publication No.4-7588. The box is configured to neutralize static electricity by blowing positive and negative ions onto dust that is attached to a carrier or wafer.

Another conventional wafer storage box for preventing the attachment of dust is disclosed in the Japanese Unexamined Patent Publication No.1-137536 and shown in FIG. 3. The box is configured to enable electricity to easily pass between the wafer, the wafer semiconductor carrier 11, the carrier case 14, and the ground cord 16. A discharge plate 12 is provided on the semiconductor wafer carrier 11 which stores the wafers. Between the wafers and the semiconductor wafer carrier 11, contacting holes 13 and 13' for the ground pins 15 and 15' are provided on the semiconductor wafer carrier 11. Ground pins 15 and 15' are provided on the carrier case 14, and a ground cord 16 is further provided.

However, in the above-described prior art, while positive and negative ions are blown onto the wafer carrier and the wafers in order to neutralize the static electricity thereof, which can cause the attachment of dust thereto, thereby preventing the attachment of dust, there was the problem that no consideration was given to the influence the positive and negative ions had on the wafer.

Additionally, in the prior art while there was the effect of preventing the attachment of dust at the point in time at which the static electricity is discharged, there was the problem that subsequent transport of the wafer carrier or the like could cause re-charging, so that dust could become attached until the electricity is discharged once again, so that this effect does not endure.

In view of the above-described drawbacks in the prior art, an object of the present invention is to provide a wafer storage box for preventing the attachment of dust to a wafer in the box.

SUMMARY OF THE INVENTION

To achieve the above-noted object, the present invention is a wafer storage box comprising a carrier which stores wafers inside thereof, wherein the wafer storage box is further provided with a box plate moving along a wafer transmission line; a box mounted on the box plate and storing the wafers inside thereof; a connection portion which connects the box to the box plate; and a charging device for charging an inside surface of the box.

The charging device may include a power source, an electrode portion provided on the box plate and applying a predetermined voltage from the power source to the inside surface of the box, an electrode portion provided on the box, and further wherein the inside surface of the box is charged by applying the predetermined voltage thereto under a condition in that the electrode portion provided on the box plate and the electrode portion provided on the box are connected to each other.

According to the present invention, when a box that stores a carrier that holds a wafer has electricity discharged to it, dust which is floating within the box is attracted to the inner walls of the box, thereby preventing the attachment of the dust to a wafer. Because the dust that has become attached to the inner walls of the box remains attached to the inner walls of the box unless the electricity is discharged from the box, the effect of preventing the attraction of dust onto the wafer endures.

DETAILED DESCRIPTION OF THE PREFERRED EMBODIMENTS

Figure 1A:
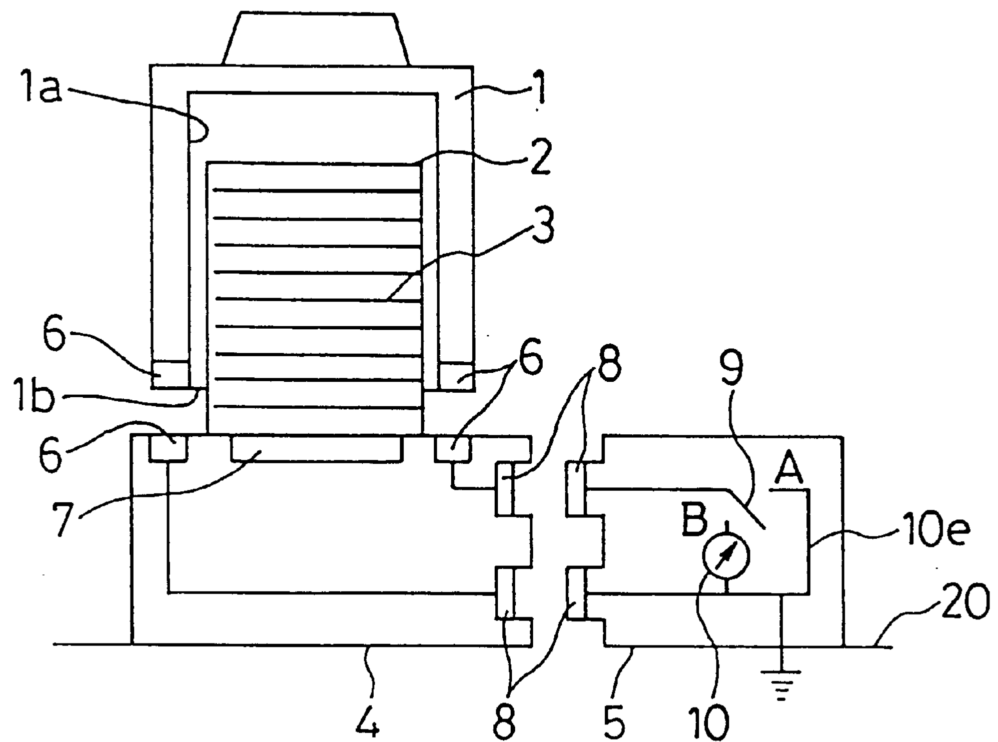
FIG. 1 shows the configuration of a dust attraction preventing mechanism which discharges electricity to a wafer storage box according to the first embodiment of the present invention.
Figure 1B:
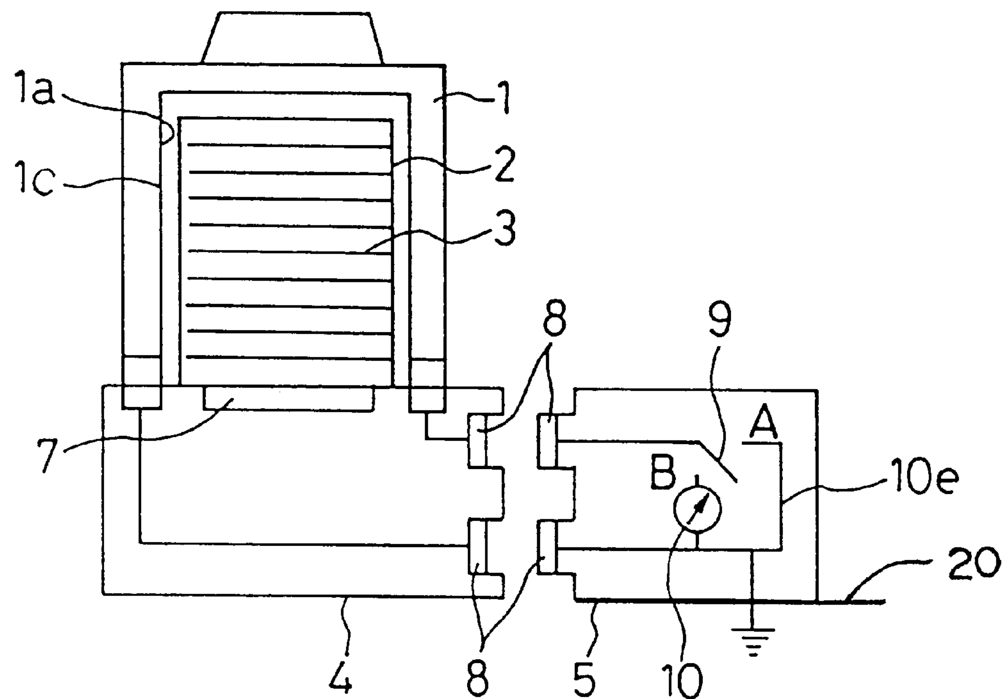

Referring to FIG. 1, the dust attraction preventing mechanism which discharges electricity to a wafer storage box according to the first embodiment of the present invention includes a carrier 2 which holds wafers 3, this carrier 2 being disposed between the box 1 and the box plate 4, which are mutually electrically joined by means of the electrodes 6, and a box plate joiner 7 causing the box 1 and the box plate 4 to be in intimate physical contact.

The wafer storage box 1 has an opening 1*b* on the bottom.

As illustrated in FIG. 1(*b*), the wafer storage box 1 and the box plate 4 are transported together by, for example, a conveyer line 20.

By virtue of the above-noted arrangement, the carrier 2 which holds wafers 3 is shut off from the outside environment. When the switch 9 of the electricity charger/discharger 5 that is electrically joined to the box plate by the electrodes 8 is set to "B", the box 1 has electricity charged to it by means of a power supply circuit 10. This causes dust 1*c* inside the box 1 to become electrostatically attracted to the inner walls 1*a* of the box 1. Thereafter, even if the box plate 4 that was joined to the box 1 is removed from the electricity charger/discharger 5, because the electricity of the box 1 remains, the electrostatic attraction effect persists. Thus, once dust 1*c* is attracted, it remains attached to the inner walls 1*a* of the box 1.

Dust that is generated by the contact of and vibration between the carrier 2 and the wafers 3 during subsequent transporting thereof is all attracted to the inner walls 1*a* of the box 1, so that this dust 1*c* is also prevented from becoming attached to the wafers 3. After the carrier 2 which holds the wafers 3 is removed from the box 1, the box 1 and the box plate 4 are once again brought into intimate physical contact by means of the box plate joiner 7, the box plate 4 being thereby electrically joined to the electricity charger/discharger 5. Then the switch 9 of the electricity charger/discharger 5 is set to "A", the result being that ground circuit 10*e* removes the electricity from the box 1, the dust 1*c* within the box 1 thereby being removed from the inner walls 1*a* of the box 1. When the box 1 is used the next time, it is re-used after removing the dust 1*c* from therein.

By performing dust collection by means of static electricity, it is possible to achieve the effect of collecting (that is, preventing) dust, making it possible to prevent dust from becoming attached to a wafer after a carrier holding the wafer is placed inside the box.

Figure 2:
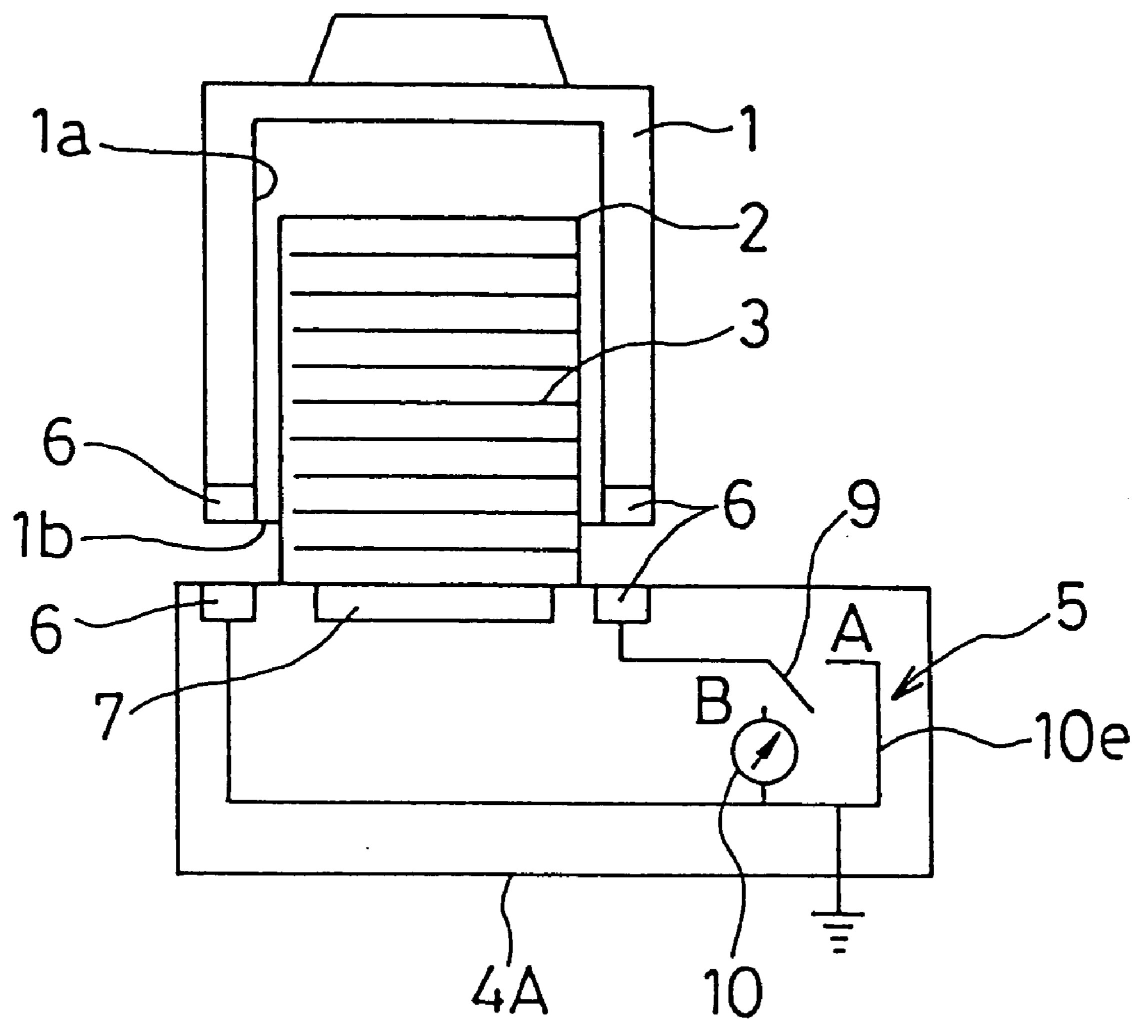
FIG. 2 shows the configuration of the second embodiment of the present invention.
Figure 3:
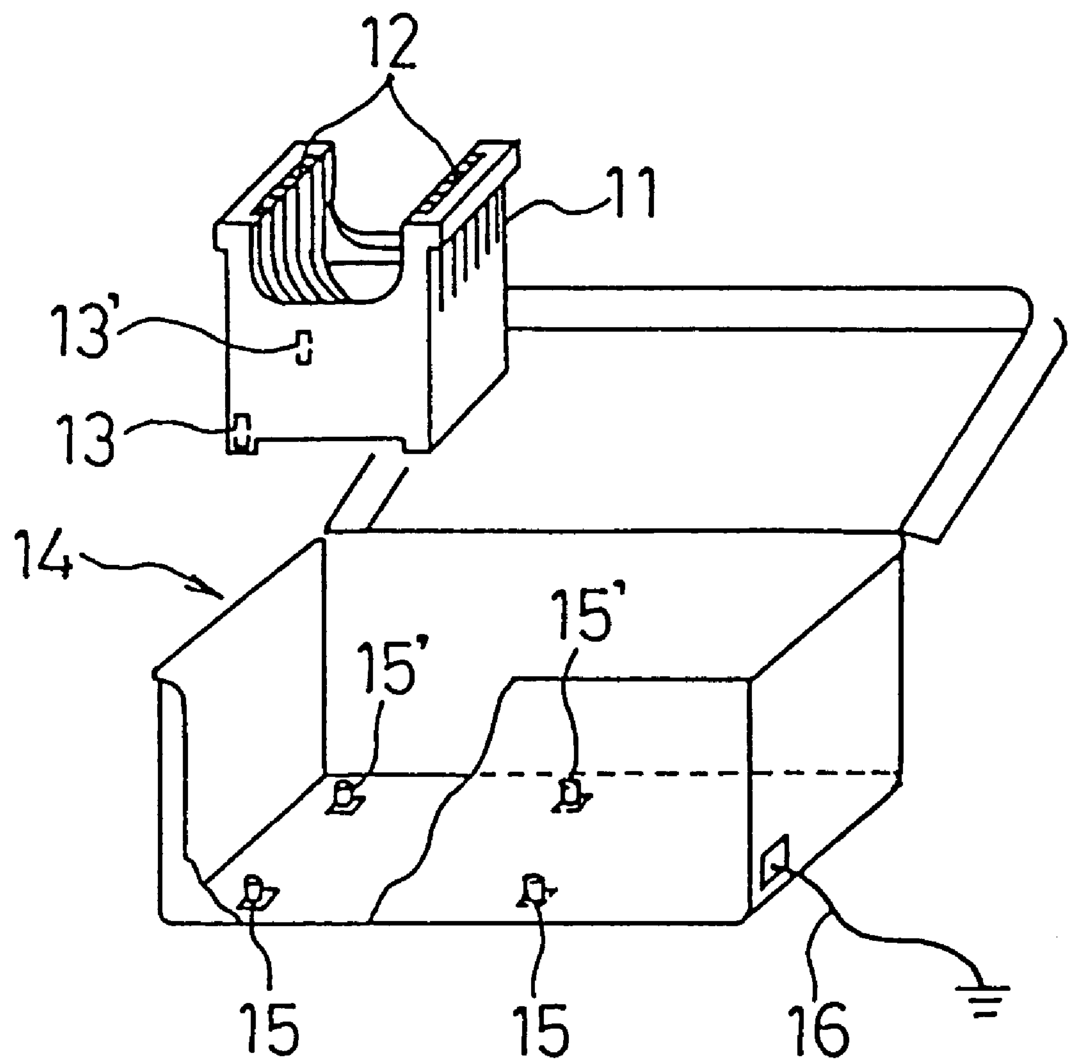
FIG. 3 shows the configuration of a semiconductor wafer carrier of the prior art.

FIG. 2 is a drawing which shows the configuration of the second embodiment of the present invention. In this embodiment, a charger/discharger 5 is integrated with box plate 4A as shown in FIG. 2.

What is claimed is:

1. A box for storing semiconductor wafers in a wafer carrier, the box comprising:

a cover enclosing a space for receiving a wafer carrier and having an opening at one side for passage of a wafer carrier, an interior wall of said cover being electrically conductive and storing an electrical charge;

a box plate removably attached to said cover closing said opening; and a charger/discharger comprising a source of electrical power selectively connected to said interior wall of said cover charging a predetermined voltage to said interior wall when connected and a ground circuit selectively connected to said interior wall discharging an electrical charge stored in said interior wall when connected.

2. The box of claim 1, wherein said box plate and said charger/discharger comprise separate units with complimentary physical and electrical connectors therebetween.

3. The box of claim 1, wherein said box plate and said charger/discharger comprise a single unit.

4. The box of claim 1, wherein said charger/discharger comprises a switch that connects said interior wall to said source of electrical power in a first position and connects said interior wall to said ground circuit in a second position.

5. The box of claim 1, wherein an entirety of an interior surface of said cover, including said interior wall, is electrically conductive.

6. A method of preventing accumulation of dust on semiconductor wafers in a wafer carrier that is in a box for storing the carrier, the method comprising the steps of:

enclosing a carrier carrying semiconductor wafers with a cover that encloses a space for the carrier, an interior wall of the cover being electrically conductive and storing an electrical charge;

removably attaching a box plate to the cover to close the opening; and selectively connecting a source of electrical power to the interior wall of the cover and charging a predetermined voltage to the interior wall, the interior wall storing an electrical charge and electrostatically attracting dust thereto when charged; and maintaining the electrical charge in the interior wall until a ground circuit is selectively connected to the interior wall discharging the electrical charge stored in the interior wall.

* * * * *